United States Patent
Shimizu

(10) Patent No.: US 9,368,990 B2
(45) Date of Patent: Jun. 14, 2016

(54) THIN-FILM CAPACITOR DEVICE

(75) Inventor: Kanji Shimizu, Kobe (JP)

(73) Assignees: Kanji Shimizu, Hyogo (JP); ENZO PLANNING CO., LTD., Tokyo (JP); Kazuhiko Takanashi, Tokyo (JP); K.S. INTERNATIONAL CO., LTD., Tokyo (JP)

( * ) Notice: Subject to any disclaimer, the term of this patent is extended or adjusted under 35 U.S.C. 154(b) by 304 days.

(21) Appl. No.: 14/239,473

(22) PCT Filed: Aug. 18, 2011

(86) PCT No.: PCT/JP2011/068715
§ 371 (c)(1),
(2), (4) Date: Jun. 25, 2014

(87) PCT Pub. No.: WO2013/024555
PCT Pub. Date: Feb. 21, 2013

(65) Prior Publication Data
US 2014/0300327 A1    Oct. 9, 2014

(51) Int. Cl.
*H02J 7/00*    (2006.01)
*B82Y 10/00*    (2011.01)
*H01L 49/02*    (2006.01)
*H02J 7/34*    (2006.01)
*H01G 4/33*    (2006.01)

(52) U.S. Cl.
CPC .............. *H02J 7/0063* (2013.01); *B82Y 10/00* (2013.01); *H01L 28/40* (2013.01); *H01L 28/60* (2013.01); *H02J 7/345* (2013.01); *H01G 4/33* (2013.01); *Y02T 10/7022* (2013.01)

(58) Field of Classification Search
CPC .......... B82Y 10/00; H01G 4/33; H01L 28/40; H01L 28/60; H02J 7/0063; H02J 7/345; Y02T 10/7022

USPC ......................................................... 320/167
See application file for complete search history.

(56) References Cited

U.S. PATENT DOCUMENTS

| | | |
|---|---|---|
| 2007/0001258 A1 | 1/2007 | Aihara |
| 2007/0121274 A1* | 5/2007 | Talvacchio ........... H01G 4/1218 361/311 |
| 2009/0315518 A1 | 12/2009 | Soma et al. |
| 2010/0246092 A1 | 9/2010 | Shibue et al. |
| 2013/0148262 A1* | 6/2013 | Shimizu ................. H01G 4/005 361/311 |

FOREIGN PATENT DOCUMENTS

| | | |
|---|---|---|
| JP | 10-285797 A | 10/1998 |
| JP | 2007-13105 A | 1/2007 |
| JP | 2008-98098 A | 4/2008 |
| JP | 2010-232445 A | 10/2010 |
| JP | 2011-249669 A | 12/2011 |

* cited by examiner

*Primary Examiner* — Vuthe Siek
(74) *Attorney, Agent, or Firm* — Birch, Stewart, Kolasch & Birch, LLP

(57) ABSTRACT

The present invention provides a thin-film capacitor device having a charging circuit and a discharge circuit and capable of stably producing a constant voltage during discharging a thin-film capacitor by an inexpensive configuration. The thin-film capacitor device is characterized by a hybrid type for temporarily storing charge upon receiving DC current from the thin-film capacitor while the voltage becomes lowering, and for supplying DC current in a state of a DC/DC inverter having a base voltage remaining so that a discharge effect continues until the amount of storage in the thin-film capacitor completely runs out.

4 Claims, 4 Drawing Sheets

CONTROL OF LOW ELECTRIC POWER OF
CAPACITOR BY INVERTER

THIN-FILM CAPACITOR DEVICE

TECHNICAL FIELD

The present invention relates to a thin-film capacitor device comprising a charging circuit and a discharge circuit.

BACKGROUND ART

As electrical energy storage devices utilizing a capacitor with large capacitance, electrolytic capacitors and multi-layer ceramic capacitors are generally used. In recent years, with the increasing demand for batteries of large capacity typically in electric vehicles, the increased capacity of lithium-ion batteries has been promoted as well as electric double-layer batteries having the function of electrolytic capacitor enhanced have actively been developed. In addition, a research for increasing the capacitance of thin-film type of multi-layer ceramic capacitors has started.

However, so-called capacitors, such as a multi-layer ceramic capacitor, involve a problem with electric current leakage, which deteriorates the general performance. Further, so-called batteries storing electrical energy by means of chemical change, such as a lithium-ion battery, involve a problem of memory effect caused, when partially being charged and discharged, and resulting in deteriorating the performance.

In view of solving the problems, for example an electrical energy storage device using a giant magneto-resistance effect is proposed in Patent Documents 1, 2 and 3.

The giant magneto-resistance effect (GMR) means a kind of quantum-mechanical effect observed in a mechanism formed alternately by a thin magnetic section and a thin nonmagnetic section. When an external magnetic field is applied, the giant magneto-resistance effect causes the electric resistance to largely change from the state of high resistance with a zero magnetic field to the state of low resistance with a high magnetic field. Therefore, the giant magneto-resistance effect can be utilized as an insulator having good performance, so that a device having the giant magneto-resistance effect can store electric energy.

Since the capacitors disclosed in Patent Documents 1, 2 and 3 have the magnetic sections formed by thin films, the increased capacitance could be attained by expanding the magnetic sections bi-dimensionally, in which case however there would be a difficulty in downsizing the devices.

A thin-film capacitor, which uses electric energy stored in a charge collector formed on an interface between an electrode material and a dielectric material, is a capacitor of large capacitance capable of charging and discharging the capacitance in the order of thousands of farads in a moment.

As for usage, it is utilizable in a wide range from a capacitor with a low capacitance for backing up memories and one with a medium capacitance for assisting the power of electric vehicles up to one with a large capacitance as an alternative for batteries storing electric power, such as a power supply of electric vehicles.

The withstand voltage of a unit capacitor (also referred to as a cell) of such a thin-film capacitor is determined by the withstand voltage of the dielectric material which is a component thereof, i.e. an insulator which separates electrons from holes, and is dependent on its substance, film thickness, uniformity and the like. For example, the withstand voltage of barium titanate-based dielectric material is approximately 200V.

Since there is the possibility that a thin-film capacitor is broken when a voltage higher than the withstand voltage of the dielectric material is applied, a plurality of unit capacitors used are connected in serial.

As previously described, when electric charge stored in a single or connected capacitors is discharged, it is rapidly discharged, and thus, if it is discharged as it is, the output of the thin-film capacitor shows the decreasing curve A plotted in FIG. 3.

In order to smooth the output, an inverter is used, whereas it becomes unable to perform conversion when the capacitor output decreases below a threshold value.

Accordingly, in order to raise the threshold value, a capacitor having its capacitance at least equal to or higher than the threshold value is additionally installed in hybrid to smooth the output, thereby making it possible to discharge electrical charge until the stored amount of the storage capacitor becomes zero.

Generally, as a solution for charging and discharging of a capacitor, there is one disclosed for example in Patent Document 1.

In case of discharging a thin-film capacitor, when the thin-film capacitor is directly connected to an inverter as shown in FIG. 1, there has occurred such a situation that conversion does not take place with current lower than a threshold for the inverter, resulting in discharging uselessly.

It is an object of the present invention to provide a thin-film capacitor device, which can be implemented into an inexpensive configuration, by which a thin-film capacitor, compact in size and large in capacitance and capable of producing large electric energy, causes an inverter to effectively perform smoothing conversion during discharging until the stored amount becomes zero.

PRIOR ART DOCUMENT(S)

Patent Documents

Patent Document 1: Japanese Patent Laid-Open Publication No. 2008-177535
Patent Document 2: Japanese Patent Laid-Open Publication No. 2008-1777536
Patent Document 3: Japanese Patent Laid-Open Publication No. 2009-049351
Patent Document 4: Japanese Patent Laid-Open Publication No. 2004-215332

DISCLOSURE OF THE INVENTION

Problem(s) to be Solved by the Invention

In a thin-film capacitor, for example, as exemplified by a circuit of FIG. 1, switches SW1 and SW2 are turned to close only a charging circuit C1 to connect the input and output terminals 8 and 9 of the thin-film capacitor 20 to a power supply unit, so that it is charged to store electric energy, and, after charged, the switches SW1 and SW2 are turned to open the charging circuit C1 and close a discharge circuit to perform discharging.

During the discharging described above, when the thin-film capacitor 20 is directly connected to an inverter 40 as shown in the figure, there has occurred such a situation that conversion does not take place with current lower than a threshold for the inverter 40, resulting in discharging uselessly.

The present invention aims at providing a thin-film capacitor device, which can be implemented into an inexpensive configuration, by which a thin-film capacitor is charged via a charging circuit and an inverter effectively performs smoothing conversion, when discharging, until the stored amount becomes zero by a discharge circuit.

Measures to Solve the Problem(s)

In order to solve the problems stated above, the invention in claim 1 is characterized by a thin-film capacitor device for performing discharging a thin-film capacitor for use in a DC circuit, wherein the thin-film capacitor comprises a first electrode made of electro-conductive material, a second electrode made of electro-conductive material and positioned to be faced with the first electrode, and a dielectric layer formed to be interposed between the first electrode and the second electrode, between the first electrode and the dielectric layer and between the second electrode and the dielectric layer there being electron collector layers, each of which includes an electron collector constituted of microparticles made of metal, semiconductor material or an electro-conductively surface-modified ceramic, the device comprising a charging circuit charging the thin-film capacitor, and a discharge circuit, the discharge circuit being of a hybrid type for temporarily storing charge upon receiving DC current from the thin-film capacitor that has been charged while the voltage becomes lowering, and for supplying DC current in a state of a DC/DC inverter having the base voltage remaining so that a discharge effect continues until the amount of storage in the thin-film capacitor completely runs out.

In accordance with the invention in claim 2, the thin-film capacitor forms a group of the thin-film capacitors switchably connected between parallel and serial connections, wherein the charging circuit and the discharge circuit are switchably connected to the thin-film capacitor group by a switch unit, so that when the charging circuit is connected the plurality of thin-film capacitors are connected in parallel to each other and when the discharge circuit is connected the plurality of thin-film capacitors are connected in serial to each other.

Further, in accordance with the invention in claim 3, the electron collector layers of the thin-film capacitor are constituted of metallic microparticles, the metallic microparticles being magnetized.

Still further, in accordance with the invention in claim 4, the dielectric layer is provided with wiring connecting the plurality of first electrodes to each other and wiring connecting the plurality of second electrodes to each other.

Advantages of the Invention

The discharge circuit is of a hybrid type for temporarily storing charge upon receiving DC current from the thin-film capacitor having electric energy stored while the voltage becomes lowering, and for supplying DC current in a state of a DC/DC inverter having a base voltage remaining. The discharge effect continues until the amount of storage in the thin-film capacitor completely runs out. It is therefore possible to stably produce a constant voltage output when discharging the thin-film capacitor for use in a DC circuit for an extensive period of time with an inexpensive configuration.

BEST MODE FOR IMPLEMENTING THE INVENTION

Figure 1:
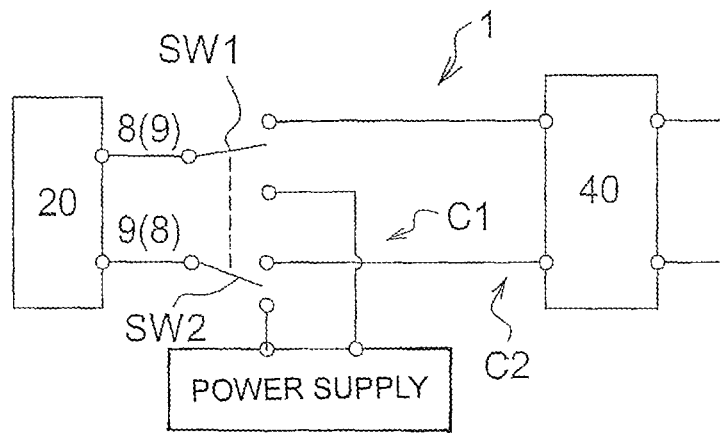
FIG. 1 is a circuit diagram of the device having a charging circuit to a thin-film capacitor and a discharge circuit without having an auxiliary capacitor additionally installed.

In the following, preferred embodiments of a thin-film capacitor device in accordance with the present invention will be described in greater detail by the aid of examples described hereafter.

First Embodiment

Preferred embodiments of a thin-film capacitor device 1 in accordance with the present invention will be described with reference to FIG. 2, et seq.

The first embodiment comprises a charging circuit C1 and a discharge circuit C2 respectively connected to one 8 (or 9) and the other 9 (or 8) of the terminals of a thin-film capacitor 20 in a switchable fashion.

The discharge circuit C2 is arranged to have an auxiliary capacitor additionally installed between the thin-film capacitor 20 and a DC/DC inverter 40 so that conversion by the inverter takes place until the amount of storage in the thin-film capacitor 20 becomes zero.

Figure 2A:
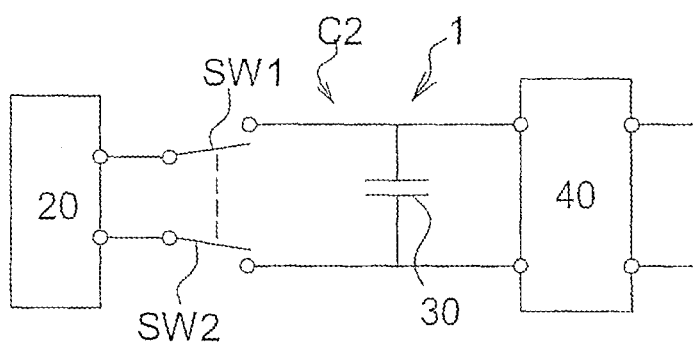
FIG. 2(a) shows a discharge circuit of a thin-film capacitor in accordance with a first embodiment.

FIG. 2(a) shows a configuration arranged so that the charging circuit C1 and the discharge circuit C2 are selectively connected by operating switches SW1, SW2 to the thin-film capacitor 20.

The thin-film capacitor may herein be provided in single or plural.

The illustrative embodiment includes the two switches cooperative with each other. In the present invention, however, one or more switches may be provided, and it does matter how the structure thereof may particularly be as far as such a switch is arranged to be operable for switching the charging circuit C1 and the discharge circuit C2.

As for the charging circuit C1 not shown, a known charging circuit can be used like in the case of FIG. 1, in which case there is the possibility that when the circuit is connected directly to a DC power supply at the time of initial charging of the thin-film capacitor 20, large current flows to exceed an allowable current value. It is therefore preferable to provide a power supply unit with a current regulator function or current control means for restraining large current from flowing.

Further, in the instant embodiment, the thin-film capacitor 20 is connected in serial to the discharge circuit C2. However, in the case of a plurality of capacitors they may be connected either in serial or in parallel.

Figure 2B:
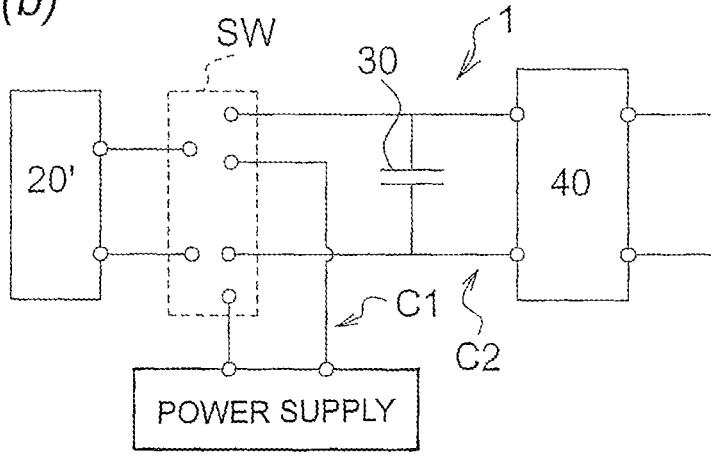
FIG. 2(b) shows a charging circuit and a discharge circuit of the thin-film capacitor in accordance with the first embodiment.

In FIG. 2(b), between a thin-film capacitor group 20' constituted of a plurality of thin-film capacitors and the charging circuit C1 and discharge circuit C2, provided is a switch unit SW such that the switching of the switch unit SW allows the circuits C1, C2 to be switched and simultaneously therewith the thin-film capacitors of the group 20' to be switched between parallel and serial connections.

Accordingly, when the switch unit SW is switched to the charging circuit C1, the thin-film capacitors of the group 20' are connected in parallel to each other to be able to be charged by the power supply unit, and when it is switched to the discharge circuit C2, the thin-film capacitors of the group 20' are connected in series to each other to be able to discharge.

It is preferable to provide the power supply unit of the charging circuit C1 with a current regulator function or current control means for restraining large current from flowing, as previously described.

An auxiliary capacitor 30 may be a thin-film capacitor while it is possible to use other known kinds of capacitor.

Figure 3A:
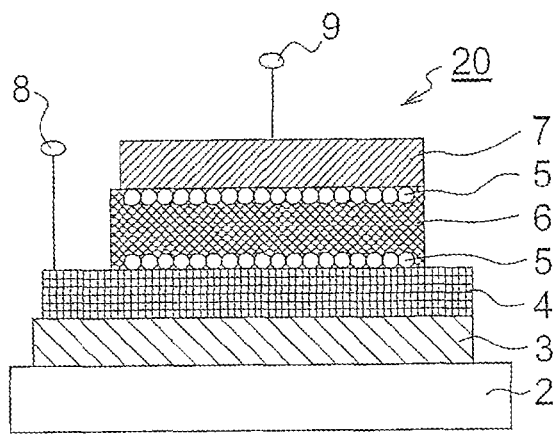
FIG. 3(a) is a cross-sectional view schematically showing the thin-film capacitor in accordance with the first embodiment.

The thin-film capacitor 20 (also the case with 20') in the instant embodiment comprises, as shown in a schematic view of FIG. 3(a), a supporting substrate 2, a buffer layer 3, a first electrode 4, an electron collector layer 3, a dielectric layer 6, a second electrode 7 and terminals 8, 9.

The supporting substrate 2 may be made of, not particularly limitative, for example, monocrystalline silicon, monocrystalline SIGe, monocrystalline Ga(a)s monocrystalline InP, monocrystalline SrTi03, monocrystalline MgO, monocrystalline LaAl03, monocrystalline Zr02, monocrystalline MgAl204, monocrystalline NdGa03, monocrystalline NdAl03, monocrystalline LaGa03, or glass board material. Among them, monocrystalline silicon is most preferable due to its lower cost. The thickness of the supporting substrate is not particularly limited as far as the overall mechanical strength of an electric energy storage device can be secured. For example, it may be set to about 10 to 1,000 μm.

The buffer layer 3 is formed as an upper layer on the supporting substrate 2 and plays a part as a barrier layer for preventing interaction between the supporting substrate 2 and an electrode film constituting the first electrode 4. Material forming the buffer layer 3 may be for example Zr02, Re02, Re02-Zr02 (Re representing yttrium (Y) or a rare-earth element), MgAl04, γ-Al203, SrTi03, LaAl03 and so on. Specifically, among them, material having its lattice structure well consistent with the supporting substrate 2 and its expansion coefficient being between those of the supporting substrate 2 and thin-film material is preferably selected to form the buffer layer 3. Further, the buffer layer may be of either monolayer or multilayer structure. The thickness of the buffer layer 3 may not be particularly limited as far as it can function as a barrier layer for preventing interaction with an electrode thin-film constituting the supporting substrate 2 and the first electrode 4. For example, it may be set to about 1 to 1,000 nm.

In addition, the buffer layer 3 may not be provided. When the buffer layer 3 is not provided, the first electrode 4 is formed on the surface of the supporting substrate 2.

The first electrode 4 is formed to be a thin-film as an upper layer on the buffer layer 3 and can be made for example of platinum (Pt), ruthenium (Ru), rhodium (Rh), palladium (Pd) iridium (Ir), gold (Au), silver (G), copper (Cu), nickel (Ni) and so on. Specifically, among them, material having its lattice structure well consistent with the supporting substrate 2 or the buffer layer 3 is preferably selected to form the first electrode. Further, the thickness of the electrode thin-film of the first electrode 4 is not particularly limited as far as it can function as an electrode of the thin-film capacitor 20, and, for example, it may be set to about 500-2,000 nm.

Figure 3B:
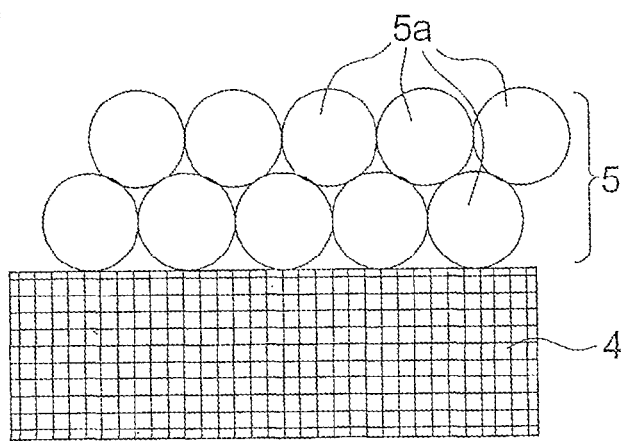
FIG. 3(b) is an enlarged view schematically showing electrodes and microparticle layers in accordance with the first embodiment.

The electron collector layer 5 is constituted of microparticles made of metal, semiconductor material or an electro-conductively surface-modified ceramic. The electron collector layer 5 of the instant embodiment is formed of, as shown in FIG. 3(b), a layer of microparticles 5a for the electron collector stacked on the surface (upper layer) of the first electrode 4 by spattering with the particle diameter being controlled. The particle diameter is set to about 200-2,000 nm and about 5-20 layers are stacked into the total thickness of about 1 μm-2 μm in complexity (two layers with the illustrative example). The material of the microparticles 5a is selected from magnetic material including soft-magnetic material, such as iron-cobalt alloy, or material having extremely high magnetic resistance at room temperature caused by a colossal effect (super giant magneto-resistance effect), such as manganese oxide. Further, as material of the microparticles 5a, the same material as the first electrode 4, i.e. non-magnetic electro-conductive metal, may be used. When the same material as the first electrode. 4 is used as material for the microparticles 5a, the electrode may have its surface area increased by 100-1,000 times. Moreover, when magnetic material is used, the stored amount of electric energy can be further increased by 50-100 times due to the magnetic field effectively collecting charge.

The dielectric layer 6 is formed as an upper layer on the electron collector layer 5 deposited on the first electrode 4. As material for the dielectric layer, used is material having a high dielectric constant, for example, barium titanate. The dielectric layer 6 can be formed by a variety of thin-film forming methods, for example, vacuum deposition, spattering, pulse laser deposition (PLD), metal-organic chemical vapor deposition (MOCVD), metal-organic decomposition (MOD), and a liquid phase method (CS method), such as a sol-gel method. Particularly, in the case where the dielectric layer 6 is required to be formed at a low temperature, plasma CVD, photo CVD, laser CVD, photo CSD or laser CSD is preferably used. In addition, the dielectric layer 6 uses dielectric material formed into a solid body in order to form, as shown in FIG. 3(a), the respective layers in the form of thin-films (the electron collector layer 5 remains formed of microparticles) to be stacked in the order.

On the surface (upper layer) of the dielectric layer 6, the electron collector layer 5 is formed, like in case of the first electrode 4, by spattering and the like with the particle diameter being controlled. The particle system is set to in the order of 200-2,000 nm, and about five layers are stacked into the thickness of approximately 1 μm-2 μm.

The second electrode 7 is formed into a thin-film as an upper layer on the electron collector layer 5 formed as the upper layer on the dielectric layer 6. The second electrode 7 is not particularly limited as far as it has an electrical conductivity, and can be made of material similar to that of the first electrode 4. However, it does not need to take account of consistency in lattice structure but can be formed at room temperature, so that it can be made of base metal, such as iron (Fe), nickel (Ni) and the like, or alloy, such as WSi, MoSi and the like.

Further, the thickness of an electrode film of the second electrode 7 is not particularly limited as far as the film functions as the other of the electrodes of the thin-film capacitor. It may be set to for example in the order of 100-10,000 nm.

The terminal 8, which is led from the first electrode 4, is one terminal for connecting to an input/output circuit (a charging circuit or a discharge circuit in the present embodiment). In order to lead the terminal 8, the first electrode 4 is partially exposed outside by masking. The terminal 9, led from the second electrode 7, is the other terminal for connecting the input/output circuit.

By the formation as described above, the electron collector layers 5 are formed between the first electrode 4 and the dielectric layer and between the second electrode 7 and the dielectric layer.

The thin-film capacitor 20 described above charges (stores) electrical charge (electric energy) therein when the terminals 8, 9 are connected to the charging circuit. On this occasion, if the microparticies 5a of the electron collector layer 5 are constituted of magnetic material, current can be prevented from leaking by the (super) giant magneto-resistance effect, whereby electrical charge can be stored in a larger amount in the dielectric layer 6. Then, by switching the terminals 8, 9 from the charging circuit to the discharge circuit in FIG. 1, the thin-film capacitor acts in such a way that it discharges the stored electric charge to supply electric energy to a load.

In accordance with the present embodiment, since the electron collector layers 6 constituted of the electron collector microparticles 5a are formed between the first electrode 4 and the dielectric layer 6 and between the second electrode 7 and the dielectric layer 6, the first and second electrodes 4 and 7 can have the surface areas thereof increased, and thus the amount of electric energy to be stored can be increased.

Further, as the microparticles 5a are made of non-carbon-based material, high voltage and high current can be taken out of it to obtain high electric energy.

Still further, since the particles 5a of the electron collector layer 5 are made of magnetic material, voltage, when applied across the first and second electrodes 4 and 7, causes an electric field such that the magnetic performance of the microparticles 5a can improve the rate of collecting charge, whereby much more electric energy can be stored.

In addition, when the microparticles 5a of the aforementioned electron collector layer 5 are made of magnetic material, the microparticle layer may be formed with the microparticles being magnetized beforehand. Alternatively, the microparticle layer may be fabricated in the electric energy forming device 1, and magnetized under an external magnetic field before the electric energy forming device 1 is brought into use. When it is magnetized in advance, there is no need of magnetization thereafter, and thus no need of circuits or other devices therefor.

In order to discharge the aforementioned thin-film capacitor 20, the auxiliary capacitor 30 is additionally provided, as described above, to perform inverter conversion until the stored amount in the thin-film capacitor 20 becomes zero (See FIG. 2).

In the figure, reference numeral 4 denotes a DC/DC inverter.

Figure 4:
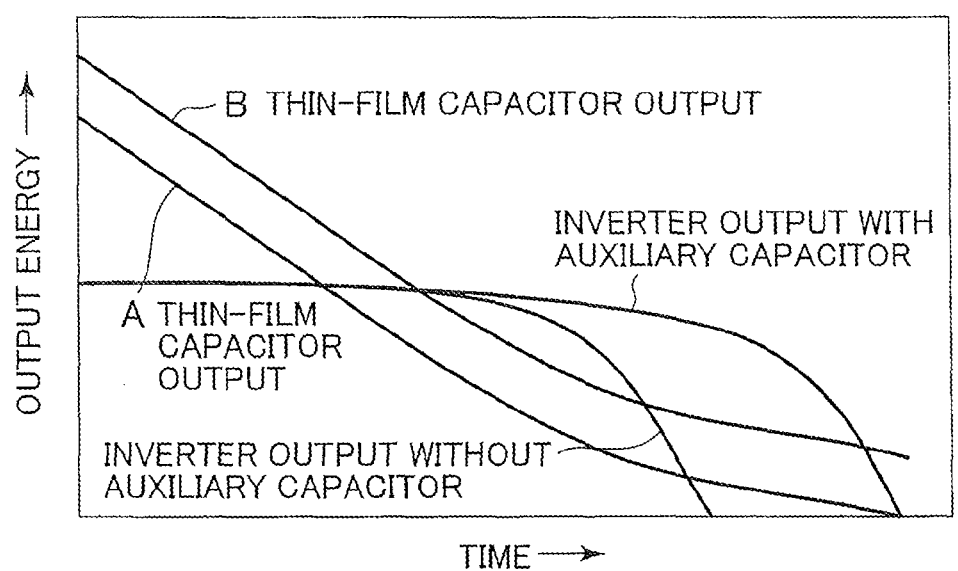
FIG. 4 is a graph comparing a comparative example of FIG. 1 with a state of inverter-conversion during discharging in accordance with the first embodiment in FIG. 2.

FIG. 4 shows a comparison between a state of inverter conversion in the discharge circuit C2 of a reference example without having said auxiliary capacitor provided therein (See FIG. 1) and a state of inverter conversion in accordance with the present embodiment with the auxiliary capacitor 20, FIG. 2, additionally installed therein.

This comparison reveals that the provision of the auxiliary capacitor 30 in the instant embodiment causes a discharging effect on stably outputting a constant voltage, in a period much longer than in the case without the additional provision thereof, until the stored amount in the thin-film capacitor totally runs out.

This is because the auxiliary capacitor receives DC current from the thin-film capacitor 20, while the voltage becomes reducing, to temporarily store the charge, and the stored amount in the thin-film capacitor supplying the DC current, while the DC/DC inverter 4 keeps the base voltage, continues the discharging effect until it totally runs out.

Second Embodiment

Figure 5A:
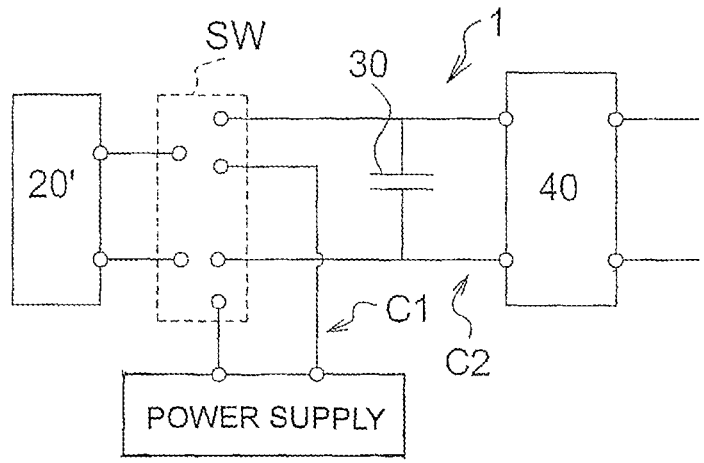
FIG. 5(a) shows a discharge circuit of a thin-film capacitor device in accordance with a second embodiment.
Figure 5B:
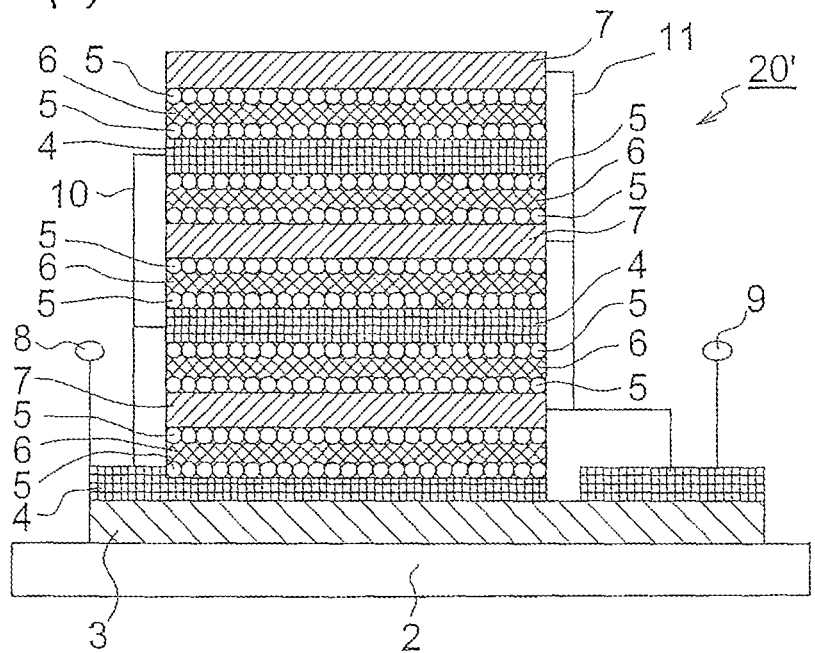
FIG. 5(b) is a cross-sectional view schematically showing the thin-film capacitor in accordance with the second embodiment.

FIG. 5(a) is a schematic view showing a charging circuit C1 and a discharge circuit C2 switchably connected to a thin-film capacitor group 20' of the second embodiment by a switch unit SW, and FIG. 5(b) shows a single unit of thin-film capacitor 20.

The thin-film capacitor 20 includes as upper layers on the supporting substrate 2 and buffer layer 3, the first electrode 4, electron collector layer 5, dielectric layer 6, electron collector layer 5, second electrode 7, electron collector layer 5, dielectric layer 6, electron collector layer 5, first electrode 4 and so on, so that the odd number of sets of alternate one of either the first or second electrode 4 or 7, the electron collector layer 5, the dielectric layer 6, and the electron collector layer 5 formed thereon are stacked to form multiple layers.

When stacking the layers, in order to form a pair of electrodes with alternate one of the electrodes bonded, they are partially exposed by masking so as to enable every other layer to be alternately bonded to each other. The instant embodiment has, for example, approximately 5-100 multi-layers (total number of multi-layers formed in a thin-film capacitor, i.e. the number of dielectric layers 6).

The first electrodes 4 are interconnected to each other by bonding wires of vertically extending electrodes 10 for bonding the first multi-layered electrodes, and the second electrodes 7 are interconnected to each other by bonding wires of vertically extending electrodes 11 for bonding the second multi-layered electrodes, whereby the odd-numbered electrodes counted from the lowest electrode form the first electrodes 4, which are separated from the even-numbered electrodes as the second electrodes 7. In other words, the aforementioned bonding wires will form one wiring for connecting the plurality of first electrodes to each other and another wiring for connecting the plurality of second electrodes to each other. Then, the terminals 8, 9 will be led out of the first and second electrodes 4 and 7, respectively, and connected to a charging circuit or a discharge circuit (See FIG. 1).

In this way, the thin-film capacitor 20 can be formed, which comprises the plurality of first electrodes 4, the plurality of second electrodes 7 and the plurality of dielectric layers 6, and has the dielectric layers 6 interposed between the first electrode 4 (electron collector layer 5) and the second electrode 7 (electron collector layer 5) stacked in order.

In accordance with the instant embodiment, the plurality of dielectric layers 6 interposed between the first electrodes 4 (electron collector layers 5) and the second electrodes 7 (electron collector layers 5) are stacked, and the electrodes in each set are interconnected to each other by the bonding wires of vertically extending electrodes 10 for bonding the first multi-layered electrodes or by the bonding wires of vertically extending electrodes 11 for bonding the second multi-layered electrodes, whereby the amount of electric energy to be stored can be increased much more than in the case of the single-layered structure.

In the instant embodiment, the thin-film capacitor 20 may be provided in single or plural, and the switch unit SW is adapted to connect the thin-film capacitors in the group 20' in parallel to each other at the time of charging and in serial to each other at the time of discharging. However, the thin-film capacitors in the group 20' may be connected in serial to each other during both charging and discharging.

In respect of discharging the single or plural thin-film capacitors 20, the instant embodiment is similar to the first embodiment in that the auxiliary capacitor 30 is provided, in the first embodiment as shown in FIG. 2, to perform inverter conversion until the stored amount in the thin-film capacitor or capacitors 20 becomes zero. The same components are thus denoted with the same reference numerals and description thereof will not be repeated.

Third Embodiment

Figure 6:
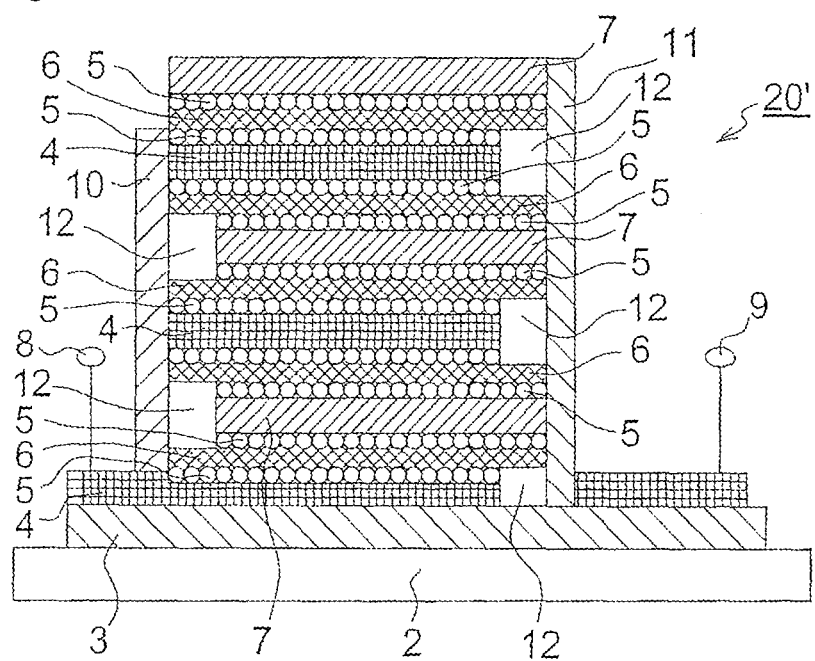
FIG. 6 is a cross-sectional view schematically showing a thin-film capacitor in accordance with a third embodiment.

The third embodiment is adapted, as shown in FIG. 6, such that, as upper layers on the supporting substrate 2 and buffer layer 3, there are deposited the first electrode 4, electron collector layer 5, dielectric layer 6, electron collector layer 5, second electrode 7, electron collector layer 5, dielectric layer 6, electron collector layer 5, first electrode 4 and so on so as to stack the odd-number of sets of alternate one of either the first or second electrode 4 or 7, the electron collector layer 5, the dielectric layer 6, and the electron collector layer 5 formed thereon to form multiple-layers.

When stacking the layers, in order to bond the respective electrodes to alternate one of vertically extending electrodes for bonding the multi-layered electrodes to form a pair of electrodes, they are partially exposed by masking so as to enable every other layer to be alternately bonded to each other, and insulating dielectric layers 12 are deposited. The instant embodiment has, for example, approximately 5-100 multi-layers (total number of multi-layers formed in a thin-film capacitor, i.e. the number of dielectric layers 6).

The first electrodes 4 are interconnected by 10 to each other and the second electrodes 7 are interconnected by 11 to each other, whereby odd-numbered electrodes as counted from the lowest electrode form the first electrodes 4, which are separated from the even-numbered electrodes as second electrodes 7. In other words, the vertically extending electrodes 10, 11 for bonding the first and second multi-layered electrodes, respectively, will constitute an electrode for connecting the plurality of first electrodes to each other and an electrode for connecting the plurality of second electrodes to each other. Then, terminals 8, 9 will be led out of the first and second electrodes 4 and 7, respectively, and connected to a charging circuit or a discharge circuit (See FIG. 1).

In this way, the thin-film capacitor 20 can be formed, which comprises the plurality of first electrodes 4, the plurality of second electrodes 7 and the plurality of dielectric layers 6, and has the dielectric layers 6 interposed between the first electrode 4 (electron collector layer 5) and the second electrode 7 (electron collector layer 5) stacked in order.

In accordance with the present embodiment, the plurality of dielectric layers 6 interposed between the first electrodes 4 (electron collector layers 5) and the second electrodes 7 (electron collector layers 5) are stacked, and the electrodes in each set are interconnected to each other by the vertically extending electrode 10 or 11 for the first or second multi-layered electrodes, respectively, whereby the amount of electric energy to be stored can be increased much more than in the case of the single-layered structure.

It is to be noted that although, in the aforementioned three embodiments, the respective layers of the thin-film capacitor 20' may be deposited in the form of rectangular and flat shape, any appropriate shapes can be selected by masking or thin-film deposition.

Discharging the thin-film capacitor 20' is similar to that of the embodiments described earlier and description thereof will not be repeated.

The thin-film capacitors in accordance with the embodiments described so far are mere examples. The present invention is not to be limited by the embodiments, and can be modified in design variously within the scope not departing from its gist.

LIST OF REFERENCE NUMERALS

1 . . . Thin-film capacitor device.
4 . . . First electrode.
5 . . . Electron collector layer (Electron collector layer made of metal, semiconductor or surface-modified ceramic).
5a . . . Microparticles of electron collector layer.
6 . . . Dielectric layer.
7 . . . Second electrode.
10 . . . Vertically extending electrode for bonding first multi-layered Electrodes (Electrode for connecting a plurality of first electrodes to each other).
11 . . . Vertically extending electrode for bonding second multi-layered electrodes (Electrode for connecting a plurality of second electrodes to each other).
12 . . . Dielectric layer embedded by masking so that the first and second electrodes are respectively connected to each other by the vertically extending respective electrodes for respectively bonding multi-layered electrodes.
20, 20' . . . Thin-film Capacitor.
30 . . . Auxiliary capacitor.
40 . . . DC/DC inverter.
C1 . . . Charging circuit.
C2 . . . Discharge circuit.
SW1, SW" . . . Operation switch.
SW . . . Switch unit.

The invention claimed is:

1. A thin-film capacitor device for discharging a thin-film capacitor for use in a DC circuit, wherein
    said thin-film capacitor comprises a first electrode made of electro-conductive material, a second electrode made of electro-conductive material and positioned to be faced with the first electrode, and a dielectric layer formed to be interposed between the first electrode and the second electrode, between the first electrode and the dielectric layer and between the second electrode and the dielectric layer there being electron collector layers, each of which includes an electron collector constituted of microparticles made of metal, semiconductor material or an electro-conductively surface-modified ceramic,
    said device comprising a charging circuit charging said thin-film capacitor, and a discharge circuit,
    said discharge circuit being of a hybrid type for temporarily storing charge upon receiving DC current from said thin-film capacitor that has been charged while voltage becomes lowering, and for supplying DC current in a state of a DC/DC inverter having a base voltage remaining so that a discharge effect continues until an amount of storage in said thin-film capacitor completely runs out.

2. The thin-film capacitor device in accordance with claim 1, wherein said thin-film capacitor forms a group of the thin-film capacitors switchably connected between parallel and serial connections, wherein said charging circuit and said discharge circuit are switchably connected to said thin-film capacitor group by a switch unit, so that when said charging circuit is connected said plurality of thin-film capacitors are connected in parallel to each other and when said discharge circuit is connected said plurality of thin-film capacitors are connected in serial to each other.

3. The electric energy storage device in accordance with claim 2, wherein the dielectric layer is provided with wiring connecting the plurality of first electrodes to each other and wiring connecting the plurality of second electrodes to each other.

4. The electric energy storage device in accordance with claim 1, wherein the dielectric layer is provided with wiring connecting the plurality of first electrodes to each other and wiring connecting the plurality of second electrodes to each other.

\* \* \* \* \*